(12) United States Patent
An et al.

(10) Patent No.: US 7,859,287 B2
(45) Date of Patent: Dec. 28, 2010

(54) DEVICE POWER SUPPLY EXTENSION CIRCUIT, TEST SYSTEM INCLUDING THE SAME AND METHOD OF TESTING SEMICONDUCTOR DEVICES

(75) Inventors: Sang-Bae An, Suwon-si (KR); Seung-Chul Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 235 days.

(21) Appl. No.: 12/201,743

(22) Filed: Aug. 29, 2008

(65) Prior Publication Data

US 2009/0058454 A1 Mar. 5, 2009

(30) Foreign Application Priority Data

Aug. 31, 2007 (KR) .................. 10-2007-0088112

(51) Int. Cl.
*G01R 31/26* (2006.01)

(52) U.S. Cl. ...................................... 324/765

(58) Field of Classification Search ........................ None
See application file for complete search history.

(56) References Cited

U.S. PATENT DOCUMENTS

| 5,930,735 | A | 7/1999 | Pun | |
|---|---|---|---|---|
| 7,292,059 | B2* | 11/2007 | Devey et al. | 324/771 |
| 7,675,310 | B2* | 3/2010 | Sullivan | 324/765 |
| 7,714,568 | B2* | 5/2010 | Wong et al. | 324/142 |
| 2007/0024314 | A1* | 2/2007 | Teng et al. | 324/765 |
| 2009/0315397 | A1* | 12/2009 | Udo | 307/31 |
| 2009/0322344 | A1* | 12/2009 | Nakano | 324/537 |

FOREIGN PATENT DOCUMENTS

| JP | 06-053299 | 2/1994 |
|---|---|---|
| KR | 1019990085985 | 12/1999 |

* cited by examiner

*Primary Examiner*—Jermele M Hollington
(74) *Attorney, Agent, or Firm*—F. Chau & Associates, LLC (57) ABSTRACT

A test system includes a controller, a power supply circuit and a device power supply (DPS) extension circuit. The controller controls a test operation for a plurality of devices under test (DUTs). The power supply circuit generates a common power voltage in response to a voltage control signal from the controller. The DPS extension circuit includes a plurality of control modules providing a plurality of source currents based on the common power voltage to the DUTs. Each control module blocks a corresponding source current in response to a magnitude of the corresponding source current.

19 Claims, 6 Drawing Sheets

DEVICE POWER SUPPLY EXTENSION CIRCUIT, TEST SYSTEM INCLUDING THE SAME AND METHOD OF TESTING SEMICONDUCTOR DEVICES

CROSS REFERENCE TO RELATED APPLICATION

This application is based on and claims priority under 35 USC §119 to Korean Patent Application No. 2007-88112, filed on Aug. 31, 2007, which is incorporated by reference herein in its entirety.

BACKGROUND OF THE INVENTION

1. Technical Field

The present disclosure relates to testing of semiconductor devices, and more particularly to a device power supply (DPS) extension circuit, a test system including the DPS extension circuit, and a method of testing semiconductor devices.

2. Discussion of the Related Art

During a semiconductor manufacturing process, a plurality of semiconductor devices may be formed on a wafer, and each portion of the wafer including a distinct semiconductor device is cut and packaged. During the manufacturing process, substantial or potential defects may be introduced in the semiconductor devices, and thus each semiconductor device needs to be tested for determining whether it is defective.

Burn-in tests are performed under severe environmental conditions to expose defects in the semiconductor devices such as integrated circuits. During the burn-in tests a portion of the semiconductor device may short causing an overcurrent. This overcurrent may cause further defects destroying the semiconductor device FIG. 1 is a block diagram illustrating a conventional test system for testing semiconductor devices.

Figure 1:
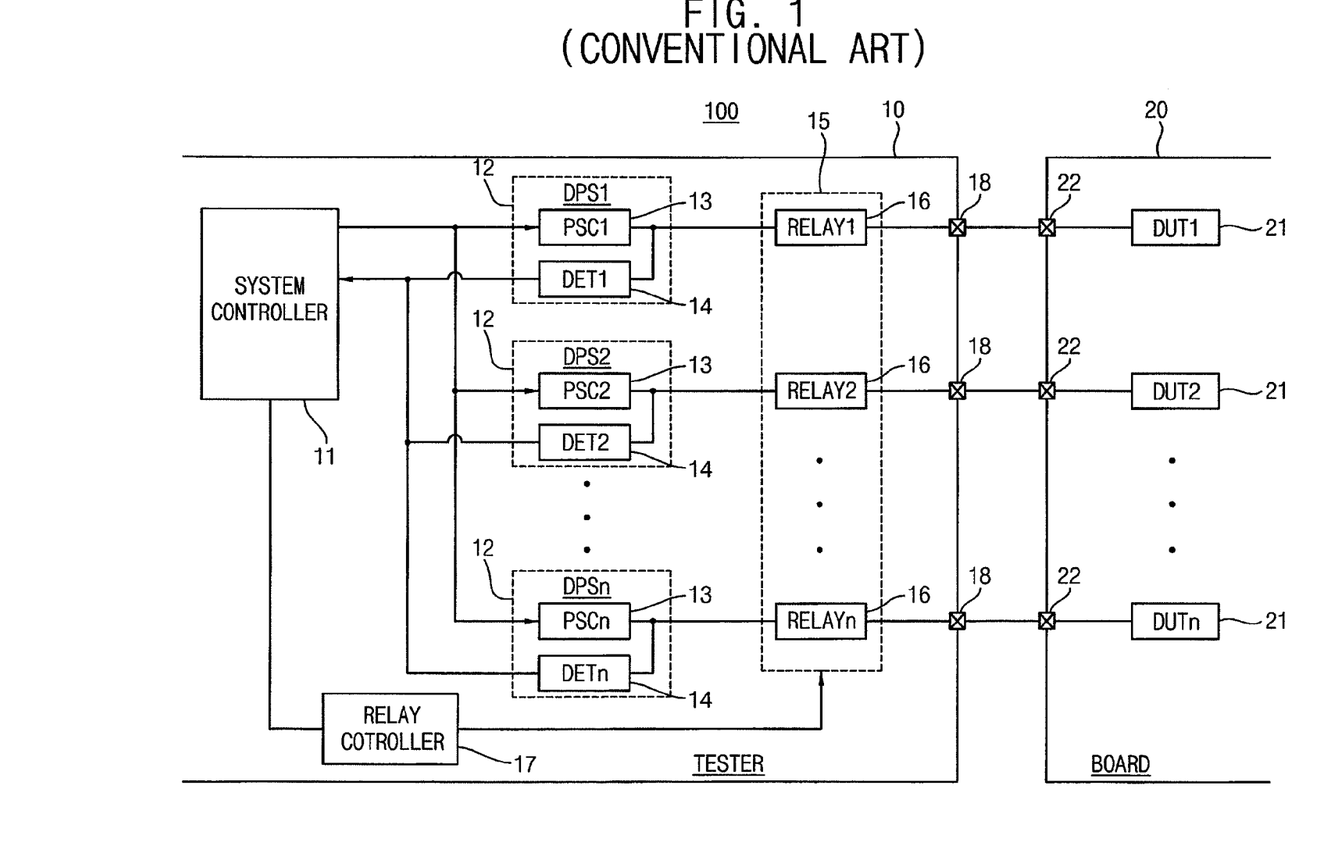
FIG. 1 is a block diagram illustrating a conventional test system for testing semiconductor devices.

Referring to FIG. 1, a test system 100 includes a tester 10 and a board 20 for connecting a plurality of devices under test (DUTs) 21 to the tester 10. The DUTs are electrically coupled to the tester 10 through pads 22 of the board 20 and pads 18 of the tester 20.

The tester 10 includes a system controller 11, a plurality of device power supplies (DPSs) 12, a blocking circuit 15, and a relay controller 17.

The system controller 11 controls overall test operation, and determines whether the DUTs are defective based on detection signals from the DPSs 12.

Each DPS 12 includes a power supply circuit (PSC) 13 and a detection circuit (DET) 14. Each power supply circuit 13 included in each DPS 12 generates a power voltage and provides the power voltage to the corresponding DUT 21. Each detection circuit 14 outputs a detection signal indicating whether the corresponding DUT 21 is defective to the system controller 11. The system controller 11 controls the relay controller 17 in response to the detection signals from the DPSs 12. The relay controller 17, in response to a control signal from the system controller 11, opens relays 16 coupled to the DUTs 21 having defects, and thus power supplied to the defective DUTs is blocked.

Accordingly, in the conventional test system 100, the system controller 11 receives the detection signals from the DPSs 12, and controls the relay controller 17 in response to the received detection signals to block power supplied to the defective DUTs.

Among devices included in the tester for determining pass of fail of semiconductor products under test, the DPS is a device for providing power suitable for testing the product. The number of DPSs included in the tester is limited due to cost and size limitations of the tester.

Two DUTs may be coupled in parallel to one DPS for simultaneous testing, and the two DUTs are determined as passed or failed at the same time. In this case, since there is no means for determining which of the two DUTs is failed, the two DUTs are considered defective. Accordingly, subsequent testing is required for determining which of the two DUTs is defective, thereby reducing testing efficiency.

A plurality of semiconductor devices may be sequentially tested using a common circuit. In this case, additional circuitry is required for implementing the sequential testing, thereby increasing the test time.

SUMMARY OF THE INVENTION

Exemplary embodiments of the present invention seek to provide a device power supply (DPS) extension circuit for simultaneously testing a plurality of devices under test (DUTs) for reducing a test time.

Exemplary embodiments of the present invention seek to provide a test system including the DPS extension circuit.

Exemplary embodiments of the present invention seek to provide a method for simultaneously testing a plurality of DUTs for reducing a test time.

A test system, accordingly to an exemplary embodiment of the present invention includes a controller, a power supply circuit and a DPS extension circuit. The controller controls a test operation for a plurality of DUTs. The power supply circuit generates a common power voltage in response to a voltage control signal from the controller. The DPS extension circuit includes a plurality of control modules providing a plurality of source currents based on the common power voltage to the DUTs. Each control module blocks a corresponding source current in response to a magnitude of the corresponding source current.

Each control module may include a switch blocking the corresponding source current in response to an overcurrent detection signal indicating whether a corresponding DUT has failed, a current-voltage converter detecting the magnitude of the corresponding source current to generate an associated detection voltage signal, and a detection signal generator generating the overcurrent detection signal in response to the detection voltage signal.

The current-voltage converter may include a detection resistor coupled between the switch and a node receiving the common power voltage, and a differential amplifier amplifying a voltage difference between ends of the detection resistor to output the detection voltage signal.

The detection signal generator may include a comparator comparing the detection voltage signal with a reference voltage signal to generate a comparison signal, and a flip-flop generating the overcurrent detection signal in response to the comparison signal.

Each control module may further include an analog-digital converter converting the detection voltage signal to a digital level detection signal indicating the magnitude of the corresponding source current.

The controller may receive the overcurrent detection signal from the control module to determine whether the DUT has failed.

The power supply circuit may include a digital-analog converter converting the voltage control signal to an analog voltage control signal, and a voltage regulator stabilizing the common power voltage based on the analog voltage control signal.

The voltage regulator may include a differential amplifier amplifying a voltage difference between the analog voltage control signal and a feedback signal derived from the common power voltage to output an amplified signal.

The controller and the power supply circuit are included in a tester, and the DPS extension circuit may be arranged outside the tester. The DPS extension circuit may be included in a performance board, where the performance board is placed between the DUTs and a header of the tester.

The DPS extension circuit may further include a selection circuit serializing the overcurrent detection signals and outputting a serialized signal to the tester.

A DPS extension circuit, according to an exemplary embodiment of the present invention, includes a plurality of control modules coupled in parallel and providing a plurality of source currents based on a common power voltage to a plurality of devices under test (DUTs). Each control module includes a switch blocking a corresponding source current in response to an overcurrent detection signal indicating whether a corresponding DUT has failed, a current-voltage converter detecting a magnitude of the corresponding source current to generate an associated detection voltage signal, and a detection signal generator generating the overcurrent detection signal based on the detection voltage signal.

The current-voltage converter may include a detection resistor coupled between the switch and a node receiving the common power voltage, and a differential amplifier amplifying a voltage difference between ends of the detection resistor to output the detection voltage signal.

The detection signal generator may include a comparator comparing the detection voltage signal with a reference voltage signal to generate a comparison signal, and a flip-flop generating the overcurrent detection signal in response to the comparison signal.

Each control module may further include an analog-digital converter converting the detection voltage signal to a digital level detection signal indicating the magnitude of the corresponding source current.

The DPS extension circuit may be arranged out of a tester that includes a controller controlling a test operation for the DUTs and a power supply circuit providing the common power voltage.

The DPS extension circuit may be included in a performance board, where the performance board is placed between the DUTs and a header of the tester.

The DPS extension circuit may further include a selection circuit serializing the overcurrent detection signals and outputting a serialized signal to the tester.

In a method of testing semiconductor devices, according to an exemplary embodiment of the present invention, a common power voltage is generated in response to a voltage control signal. A plurality of source currents is provided based on the common power voltage to a plurality of DUTs. A corresponding source current is blocked based on a magnitude of the current.

Each of the source currents may be blocked by providing a plurality of control modules coupled in parallel and between the DUTs and a node receiving the common power voltage, each control module detecting the magnitude of the corresponding source current.

In providing the plurality of control modules, the control modules may be arranged outside a tester that includes a controller configured to control a test operation for the DUTs and a power supply circuit configured to provide the common power voltage. The control modules may be included in a performance board, where the performance board is placed between the DUTs and a header of the tester.

The method may further include determining, based on overcurrent detection signals, whether each DUT has failed.

Accordingly, a test time may be reduced by simultaneously testing a plurality of semiconductor devices and also power supplied to defective devices may be promptly blocked.

BRIEF DESCRIPTION OF THE DRAWINGS

Exemplary embodiments of the present invention will become apparent by reference to the following detailed description taken in conjunction with the accompanying drawings, wherein.

DETAILED DESCRIPTION OF EXEMPLARY EMBODIMENTS

Hereinafter, exemplary embodiments of the present invention will be described in detail with reference to the accompanying drawings. This invention may, however, be embodied in many different forms and should not be construed as limited to the embodiments set forth herein. Like reference numerals refer to like elements throughout this application.

It will be understood that when an element is referred to as being "connected" or "coupled" to another element, it can be directly connected or coupled to the other element or intervening elements may be present.

Figure 2:
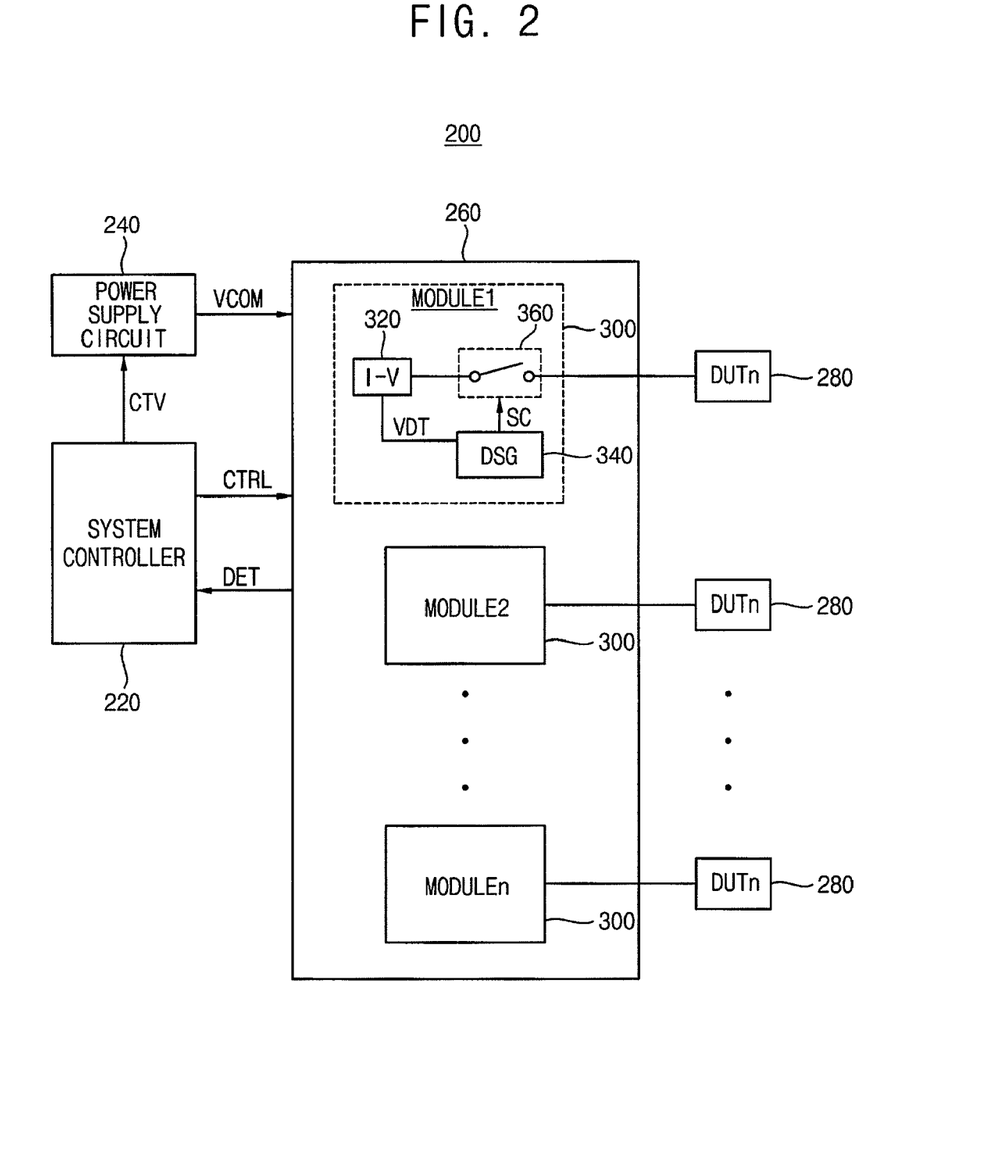
FIG. 2 is a block diagram illustrating a test system according to an exemplary embodiment of the present invention.

FIG. 2 is a block diagram illustrating a test system according to an exemplary embodiment of the present invention.

Referring to FIG. 2, a test system 200 includes a controller 220, a power supply circuit 240 and a device power supply (DPS) extension circuit 260.

The controller 220 controls a test operation for a plurality of devices under test (DUTs) 280. The power supply circuit 240 generates a common power voltage VCOM in response to a voltage control signal CTV from the controller 220.

The DPS extension circuit 260 includes a plurality of control modules 300 for providing a plurality of source currents based on the common power voltage VCON respectively to the DUTs 280. The control modules 300 may be coupled in parallel between a node receiving the common power voltage VCOM and the DUTs. As such, The DPS extension circuit 260 supplies power to the DUTs 280 based on the common power voltage VCOM.

Each control module 300 may block its corresponding source current based on a magnitude of the current. When the corresponding source current exceeds a predetermined value, the control module 300 may consider the source current as an overcurrent due to a defect in the corresponding DUT, and block the source current from flowing into the defective DUT.

For simultaneously testing the semiconductor devices, the test system 200 includes the DPS extension circuit 260, commonly powered using the power supply circuit 240 to control power supplied to the DUTs 280 using the control modules 300, therefore occupying a relatively small area. Accordingly, the tester size may be kept small and also the layout may be conveniently changed according to the number of DUTs to be tested simultaneously.

The DUTs 280 may be memory chips or other IC chips formed on a wafer.

Figure 3:
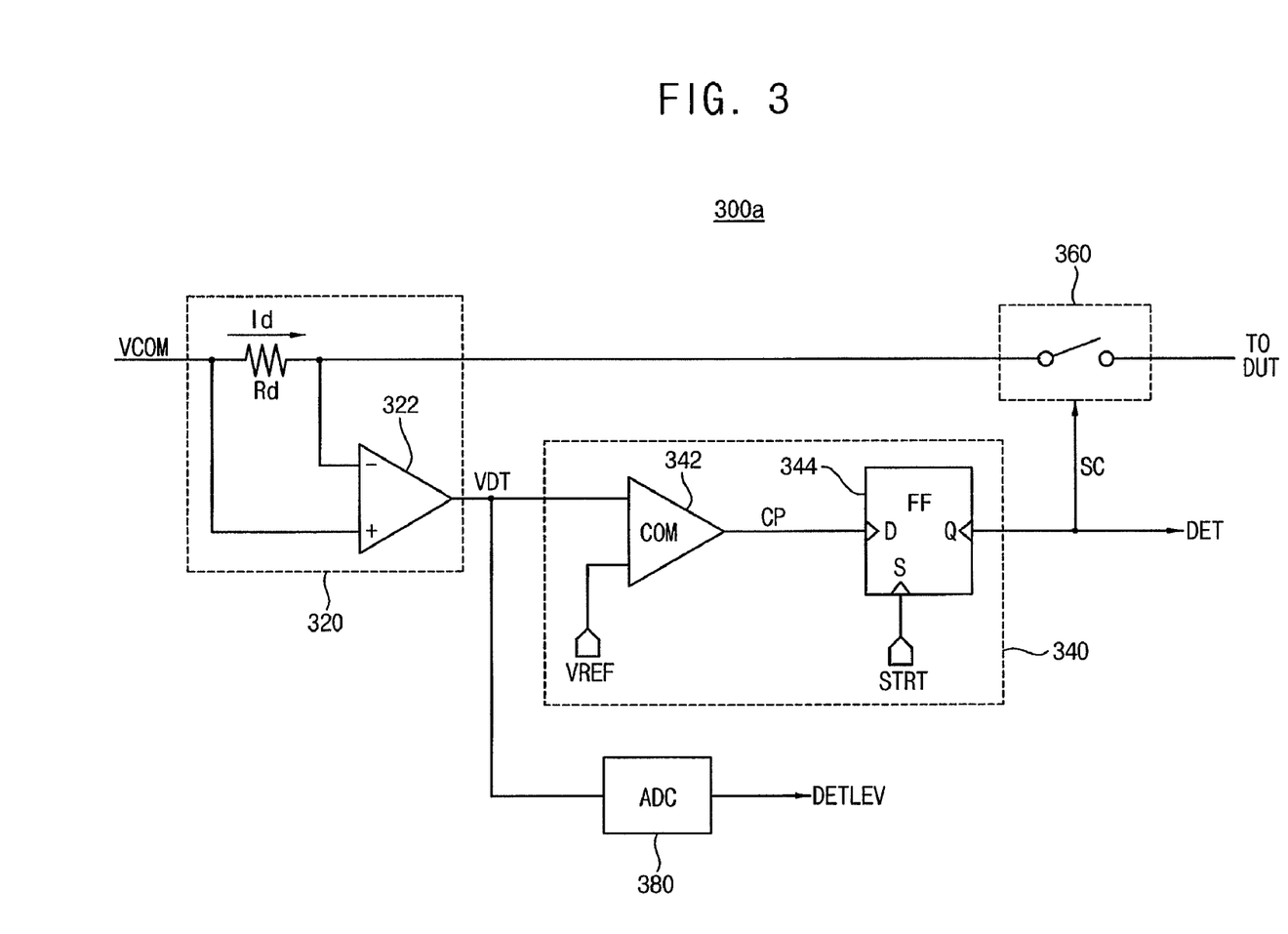
FIG. 3 is a circuit diagram illustrating an example of a control module included in the test system of FIG. 2.

FIG. 3 is a circuit diagram illustrating an example of a control module included in the test system of FIG. 2.

The DPS extension circuit 260 of FIG. 2 may include a plurality of control modules 300a as illustrated in FIG. 3. The control modules included in the DPS extension circuit 260 of FIG. 2 may have the same configuration or may have modified configurations depending on the DUTs 280 being simultaneously tested.

Referring to FIG. 3, each control module 300a may include a current-voltage converter 320, a detection signal generator 340, and a switch 360.

The switch 360 blocks the corresponding source current Id in response to an overcurrent detection signal DET indicating whether the corresponding DUT has failed. That is, the overcurrent detection signal DET may be used as a switch control signal SC. The current-voltage converter 320 detects the magnitude of the source current Id to generate a detection voltage signal VDT indicating the magnitude of the source current Id. The detection signal generator 340 generates the overcurrent detection signal DET based on the detection voltage signal VDT.

Referring back to FIG. 2, the controller 220 may receive the overcurrent detection signals DET respectively provided by the control modules 300 to determine which of the respective DUTs has failed. As mentioned above, the overcurrent detection signal DET may be used as the switch control signal SC, the switch 360 may be opened or closed according to a logic stage of the overcurrent detection signal DET. The switch 360 may be implemented with a switching element such as a relay, a transistor, etc.

The current-voltage converter 320, as illustrated in FIG. 3, may include a detection resistor Rd and a differential amplifier 322. The detection resistor Rd is coupled between the switch 360 and a node receiving the common power voltage VCOM. Input terminals of the differential amplifier 322 are coupled to both ends of the detection resistor Rd, and the differential amplifier 322 amplifies a voltage difference, which is in proportion to the source current Id, between both ends of the detection resistor to output the detection voltage signal VDT.

The detection signal generator 340, as illustrated in FIG. 3, may include a comparator 342 and a flip-flop 344. The comparator 342 compares the detection voltage signal VDT with a reference voltage signal VREF to generate a comparison signal CP. The reference voltage signal VREF is set to a threshold value that indicates upper limit of the source current Id for determining whether the corresponding DUT has failed. The comparison signal CP output from the comparator 342 may be activated when the detection voltage signal VDT output from the current-voltage converter 320 is higher than the reference voltage signal VREF.

The flip-flop 344 generates the overcurrent detection signal DET in response to the comparison signal CP. For example, the flip-flop 344 may activate the overcurrent detection signal DET in synchronization with a rising edge of the comparison signal CP. The flip-flop 344 may include two input terminals, that is, data terminal D and a control terminal S, and an output terminal Q. For example, the flip-flop 344 may be a flip-flop of set/reset type where two NOR logic gates are cross-coupled. The flip-flop 344 may be reset to a first logic state, e.g., a logic low state, in response to a control signal STRT that is applied to the control terminal S whenever new DUTs 280 are loaded to be tested. When the comparison signal CP transitions, for example, from a logic low level to a logic high level indicating a rising edge while the flip-flop 344 is in a reset state, a second logic state, e.g., a logic low state is stored in the flip-flop 344. The stored second logic state is maintained and the flip-flop 344 outputs the overcurrent detection signal DET having a logic high level until the flip-flop 344 is reset again in response to the control signal STRT. The switch 360 blocks the source current Id in response to the overcurrent detection signal DET having a logic high level. Thus the overcurrent detection signal DET maintains the logic high level even when the source current is decreased after the switch 360 is opened.

The reference voltage signal VREF may be provided from the controller 220 or may be provided as a fixed value through voltage dividing resistors. The control signal STRT for resetting the flip-flop 344 may indicate a test period and may be provided from the controller 220.

As illustrated in FIG. 3, each control module included in the DPS extension circuit 260 may further include an analog-digital converter 380. The analog-digital converter 380 may convert the detection voltage signal to a level detection signal DETLEV, which is a digital signal indicating the magnitude of the corresponding source current Id. The level detection signal DETLEV may be used for determining a performance of the corresponding DUT according to test modes, as well as for determining whether the corresponding DUT has failed.

Each control module 300a may block the source current Id when a defect in the DUT is detected, regardless of when the defect information is transferred to the controller 220. As such, serious defects that could destroy the DUT may be prevented by such prompt blocking of the overcurrent, thereby improving the yield of the semiconductor devices.

Figure 4:
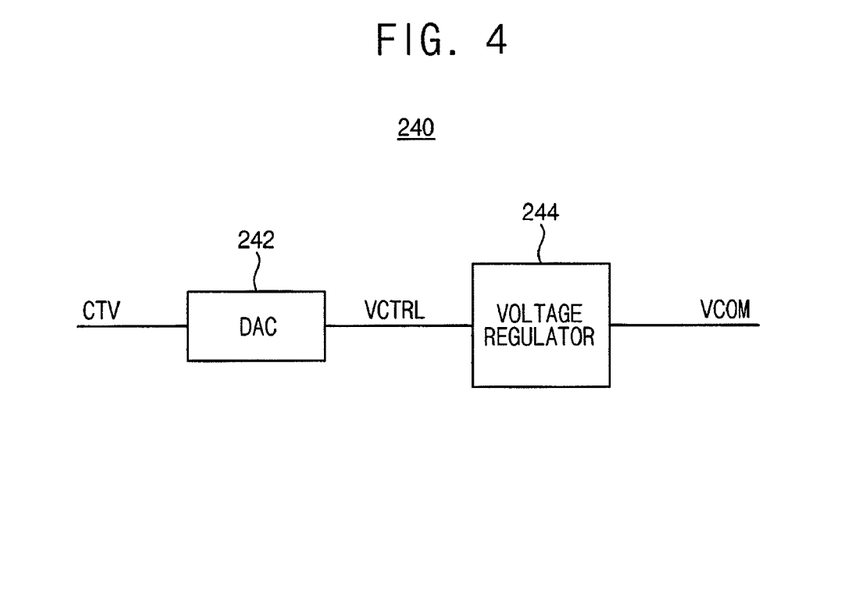
FIG. 4 is a block diagram illustrating an example of a power supply circuit included in the test system of FIG. 2.

FIG. 4 is a block diagram illustrating an example of a power supply circuit included in the test system of FIG. 2.

Referring to FIG. 4, a power supply circuit 240 may include a digital-analog converter 242 and a voltage regulator 244. The digital-analog converter 242 converts the voltage control signal CTV provided from the controller 220 to an analog voltage control signal VCTRL. When the voltage control signal CTV provided from the controller 220 is an analog signal, the digital-analog converter 242 may be omitted and the voltage control signal CTV may be directly provided to the voltage regulator 244.

The voltage regulator 244 stabilizes the common power voltage VCOM based on the analog voltage control signal VCTRL and outputs the stable common power voltage VCOM.

Figure 5:
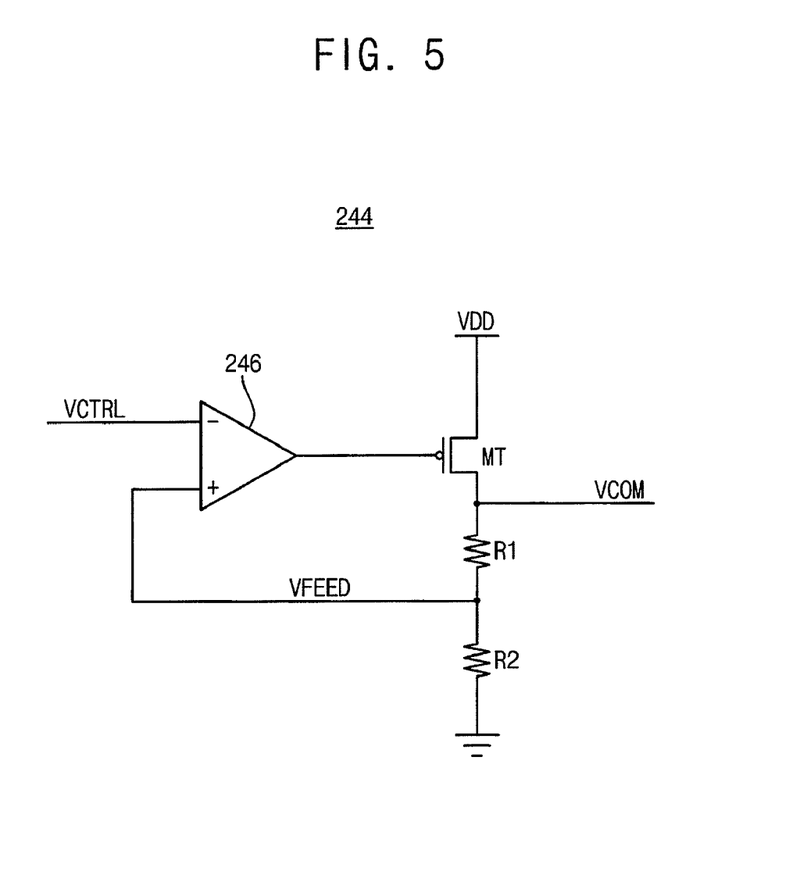
FIG. 5 is a circuit diagram illustrating an example of a voltage regulator included in the power supply circuit of FIG. 4.

FIG. 5 is a circuit diagram illustrating an example of a voltage regulator included in the power supply circuit of FIG. 4.

Referring to FIG. 5, the voltage regulator 244 may include a differential amplifier 246, a MOS transistor MT, and division resistors R1 and R2. The differential amplifier 246 amplifies a voltage difference between the analog voltage control signal VCTRL and a feedback signal VFEED associated with the common power voltage VCOM and outputs an amplified signal. For example, the feedback signal VFEED may be provided by dividing the common power voltage VCOM using the division resistors R1 and R2 as illustrated in FIG. 5. A current flowing through the MOS transistor MT varies in response to the amplified signal from the differential amplifier 246, and the common power voltage VCOM is determined according to the current flowing through the MOS transistor MT. As such, the voltage regulator 244 may stabilize and maintain the common power voltage VCOM.

Accordingly, even when the sum of the source currents Id flowing into the DUTs varies, the voltage regulator may provide a substantially constant power voltage.

Figure 6:
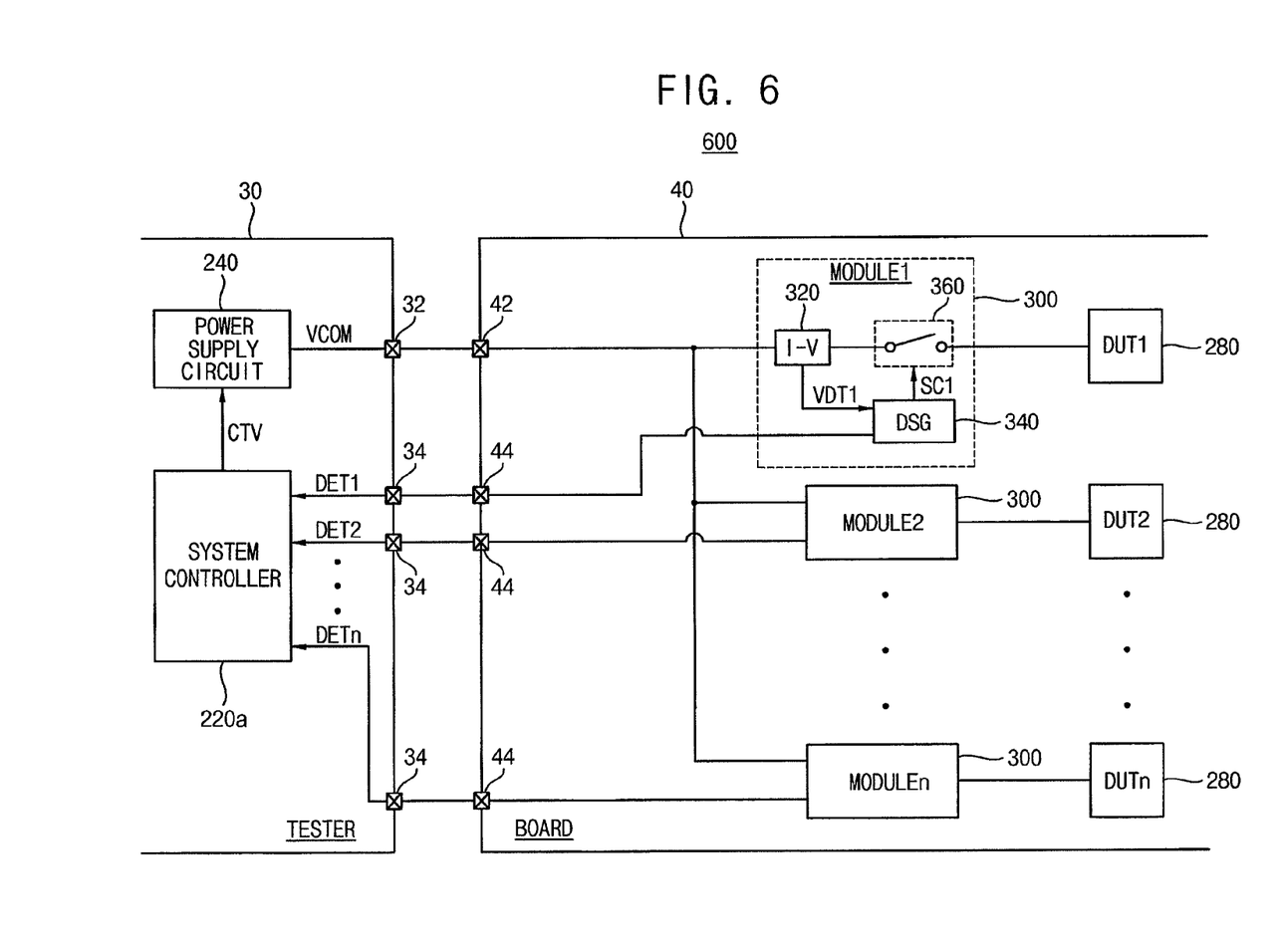
FIGS. 6 and 7 are block diagrams illustrating test systems according to some exemplary embodiments of the present invention.
Figure 7:
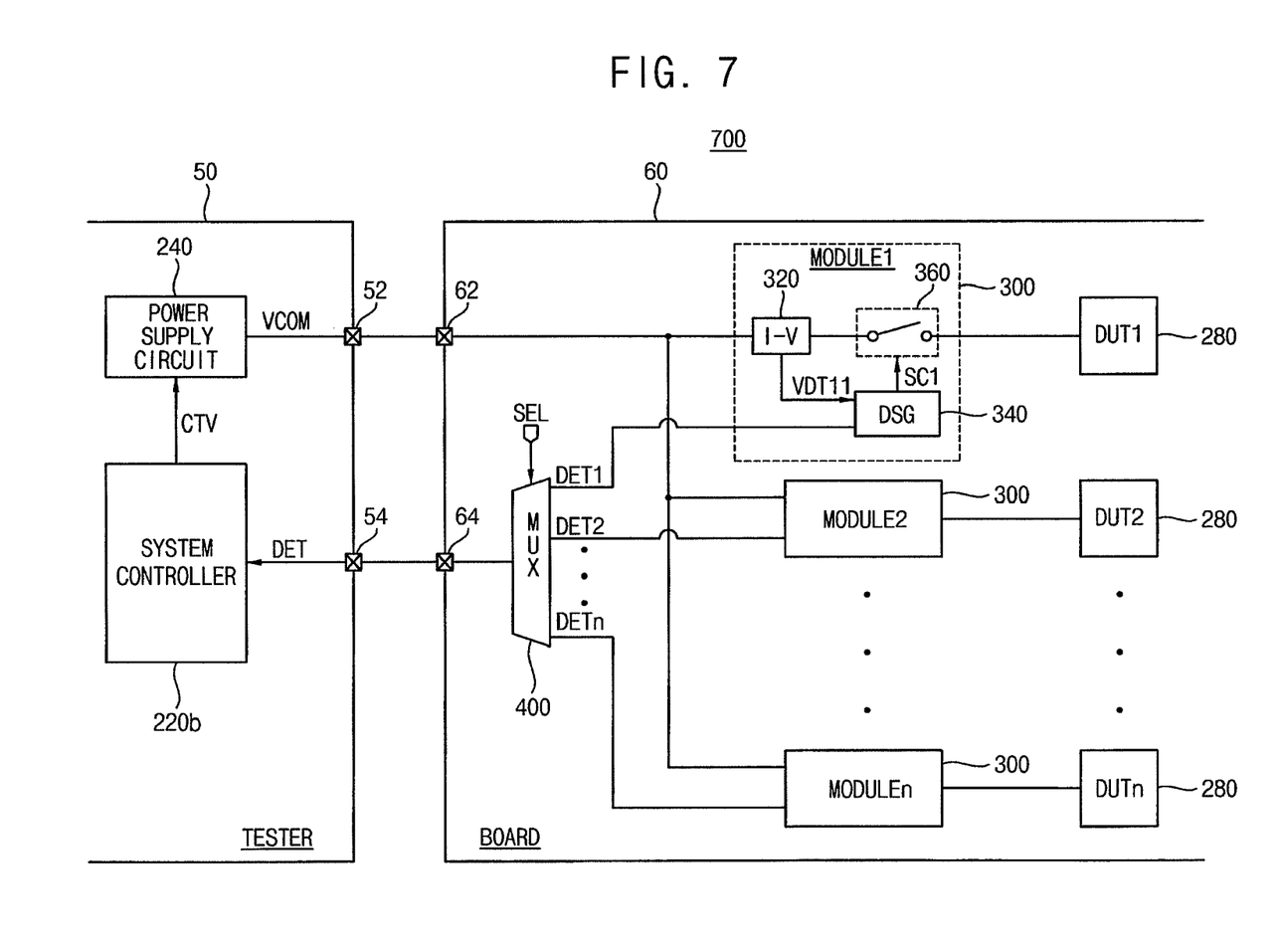

FIGS. 6 and 7 are block diagrams illustrating test systems according to exemplary embodiments of the present invention.

Exemplary embodiments, where a DPS extension circuit including a plurality of control modules is arranged out of a tester, are illustrated in FIGS. 6 and 7.

Referring to FIG. 6, a test system 600 includes a tester 30 and a board 40. A controller 220a and a power supply circuit 240 are included in the tester 30, and control modules 300 are included in the board 40. The DUTs 280 may be electrically coupled to the tester 30 through pads 42 and 44 of the board 40 and pads 32 and 34 of the tester 30.

In general, a tester for testing semiconductor devices has a header for connections to DUTs, and a performance board, a probe card, etc., placed between the header of the tester and the DUTs. In an exemplary embodiment, the DPS extension circuit including the control modules 300 may be included in the performance board.

The controller 220a controls a test operation for the DUTs 280, and receives the overcurrent detection signals DET1, DET2, and DETn through the pads 34 and 44. The overcurrent detection signals DET1, DET2, and DETn indicate, respectively, whether the corresponding DUT has failed. The power supply circuit 240 generates a common power voltage VCOM in response to a voltage control signal CTV from the controller 220, and outputs the common power voltage VCOM to the pad 32.

The control modules 300 in the DPS extension circuit 260 receive the common power voltage VCOM through the pad 42 and supply power respectively to the DUTs 280 using the common power voltage VCOM.

As described referring to FIGS. 2 and 3, each control module 300 may block the corresponding source current based on a magnitude of the current. When the corresponding source current exceeds a predetermined value, the control module 300 may consider the source current as an overcurrent produced because of a defect of the corresponding DUT, and block the source current from flowing into the defective DUT.

As such, the controller 220a and the power supply circuit 240 may be included in the tester 30, and the DPS extension circuit may be arranged out of the tester 30. Accordingly, the tester 30 size may be kept small, and also the layout of the system 600 may be conveniently changed according to the number of DUTs to be tested.

Referring to FIG. 7, a test system 700 includes a tester 50 and a board 60. A controller 220b and a power supply circuit 240 are included in the tester 50, and control modules 300 are included in the board 60. The DUTs 280 may be electrically coupled to the tester 50 through pads 62 and 64 of the board 60 and pads 52 and 54 of the tester 50.

Compared with the test system 600 of FIG. 6, the test system 700 of FIG. 7 further includes a selection circuit 400. The selection circuit 400 serializes the overcurrent detection signals DET1, DET2 and DETn respectively indicating whether each of the DUTs 280 has failed. A serialized detection signal DET is output to the controller 220b through the pad 64 of the board 60 and the pad 52 of the tester 50. The selection circuit 400 may be implemented with a serializer or multiplexer, and a selection signal SEL for controlling the selection circuit 400 may be provided from the controller 220b.

In the configuration of the test system 700, the number of pads of the tester 50 and the board 60 may be reduced. Furthermore, the output timing of the overcurrent detection signals DET1, DET2 and DETn may be efficiently controlled by the selection signal SEL.

Exemplary embodiments have been described for use in testing a plurality of semiconductor devices such as memory chips or other IC chips formed on a wafer. However, the exemplary embodiments are not limited to testing devices on a wafer and may be used to test arbitrary semiconductor devices that require the DPS.

In accordance with exemplary embodiments of the present invention, a test time may be reduced by simultaneously testing a plurality of semiconductor devices, using a plurality of control modules coupled to a power supply circuit. In addition, power supplied to defective devices may be promptly blocked regardless of the determination by a controller as to whether the device has failed, thereby preventing further damage that could destroy the defective device. A DPS extension circuit according to exemplary embodiments of the present invention occupies a relatively small area and uses a common power supply circuit. Furthermore a DPS extension circuit according to exemplary embodiments of the present invention may be arranged outside the tester, and thus the tester may be kept small and the layout may be conveniently changed according to the number of DUTs to be tested.

Although exemplary embodiment of the present invention have been described for illustrative purposes, those skilled in the art will appreciate the various modifications, additions and substitutions are possible, without departing from the scope and spirit of the disclosure.

What is claimed is:

1. A test system comprising:
   a controller controlling a test operation for a plurality of devices under test (DUTs);
   a power supply circuit generating a common power voltage in response to a voltage control signal from the controller; and
   a device power supply (DPS) extension circuit including a plurality of control modules providing a plurality of source currents based on the common power voltage to the DUTs, each control module blocks a corresponding source current in response to a magnitude of the corresponding source current,
   wherein each control module includes:
   a switch blocking the corresponding source current in response to an overcurrent detection signal indicating whether a corresponding DUT has failed;
   a current-voltage converter detecting the magnitude of the corresponding source current to generate an associated detection voltage signal; and
   a detection signal generator generating the overcurrent detection signal in response to the detection voltage signal.

2. The test system of claim 1, wherein the current-voltage converter includes:
   a detection resistor coupled between the switch and a node receiving the common power voltage; and
   a differential amplifier amplifying a voltage difference between ends of the detection resistor to output the detection voltage signal.

3. The test system of claim 1, wherein the detection signal generator includes:
   a comparator comparing the detection voltage signal with a reference voltage signal to generate a comparison signal; and
   a flip-flop generating the overcurrent detection signal in response to the comparison signal.

4. The test system of claim 1, wherein each control module further includes:
an analog-digital converter converting the detection voltage signal to a digital level detection signal indicating the magnitude of the corresponding source current.

5. The test system of claim 1, wherein the controller receives the overcurrent detection signal from the control module to determine whether the DTU has failed.

6. A test system comprising:
a controller controlling a test operation for a plurality of devices under test (DUTs);
a power supply circuit generating a common power voltage in response to a voltage control signal from the controller; and
a device power supply (DPS) extension circuit including a plurality of control modules providing a plurality of source currents based on the common power voltage to the DUTs, each control module blocks a corresponding source current in response to a magnitude of the corresponding source current
wherein the power supply circuit includes:
a digital-analog converter converting the voltage control signal to an analog voltage control signal; and
a voltage regulator stabilizing the common power voltage based on the analog voltage control signal.

7. The test system of claim 6, wherein the voltage regulator includes:
a differential amplifier amplifying a voltage difference between the analog voltage control signal and a feedback signal derived from the common power voltage to output an amplified signal.

8. The test system of claim 1, wherein the controller and the power supply circuit are included in a tester, and the DPS extension circuit is arranged outside the tester.

9. The test system of claim 8, wherein the DPS extension circuit is included in a performance board, and the performance board is placed between the DUTs and a header of the tester.

10. The test system of claim 8, wherein the DPS extension circuit further includes:
a selection circuit serializing the overcurrent detection signals and outputting a serialized signal to the tester.

11. A device power supply (DPS) extension circuit comprising:
a plurality of control modules coupled in parallel and providing a plurality of source currents based on a common power voltage to a plurality of devices under test (DUTs), each control module including:
a switch blocking a corresponding source current in response to an overcurrent detection signal indicating whether a corresponding DUT has failed;
a current-voltage converter detecting a magnitude of the corresponding source current to generate an associated detection voltage signal; and
a detection signal generator generating the overcurrent detection signal in response to the detection voltage signal.

12. The DPS extension circuit of claim 11, wherein the current-voltage converter includes:

a detection resistor coupled between the switch and a node receiving the common power voltage; and
a differential amplifier amplifying a voltage difference between ends of the detection resistor to output the detection voltage signal.

13. The DPS extension circuit of claim 11, wherein the detection signal generator includes:
a comparator comparing the detection voltage signal with a reference voltage signal to generate a comparison signal; and
a flip-flop generating the overcurrent detection signal in response to the comparison signal.

14. The DPS extension circuit of claim 11, wherein each control module further includes:
an analog-digital converter converting the detection voltage signal to a digital level detection signal indicating the magnitude of the corresponding source current.

15. The DPS extension circuit of claim 11, wherein the DPS extension circuit is arranged outside a tester that includes a controller controlling a test operation for the DUTs and a power supply circuit providing the common power voltage.

16. The DPS extension circuit of claim 15, wherein the DPS extension circuit is included in a performance board, and the performance board is placed between the DUTs and a header of the tester.

17. The DPS extension circuit of claim 15, further comprising:
a selection circuit serializing the overcurrent detection signals and outputting a serialized signal to the tester.

18. A method of testing semiconductor devices, comprising:
generating, at a power supply circuit, a common power voltage in response to a voltage control signal;
providing, from a device power supply (DPS) extension circuit, a plurality of source currents based on the common power voltage to a plurality of devices under test (DUTs); and
blocking, at a control module in the DPS extension circuit, a corresponding source current in response to a magnitude of the corresponding source current, wherein the blocking comprises:
blocking, at a switch in the control module, the corresponding source current in response to an overcurrent detection signal indicating whether a corresponding DUT has failed;
detecting, at a current-voltage converter in the control module, the magnitude of the corresponding source current to generate an associated detection voltage signal; and
generating, at a detection signal generator in the control module, the overcurrent detection signal in response to the detection voltage signal.

19. The method of claim 18, wherein
a plurality of the control modules are coupled in parallel and between the DUTs and a node receiving the common power voltage, each control module detecting the magnitude of the corresponding source current.

* * * * *